(12) United States Patent
Chen et al.

(10) Patent No.: US 8,644,441 B2
(45) Date of Patent: Feb. 4, 2014

(54) CLOCK GENERATORS AND CLOCK GENERATION METHODS THEREOF

(75) Inventors: Bo-Jiun Chen, Taipei County (TW); Shang-Ping Chen, Tai-Chung (TW); Ping-Ying Wang, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 1295 days.

(21) Appl. No.: 12/209,485

(22) Filed: Sep. 12, 2008

(65) Prior Publication Data
US 2009/0128201 A1 May 21, 2009

Related U.S. Application Data

(63) Continuation-in-part of application No. 11/940,486, filed on Nov. 15, 2007.

(51) Int. Cl.
*H03D 3/24* (2006.01)

(52) U.S. Cl.
USPC ........... 375/376; 375/373; 375/371; 375/354; 375/130; 327/157; 327/148; 327/147; 327/149; 327/150

(58) Field of Classification Search
USPC .......... 375/376, 373, 371, 354, 130; 327/157, 327/148, 147, 149, 150
See application file for complete search history.

(56) References Cited

U.S. PATENT DOCUMENTS

| | | | |
|---|---|---|---|
| 7,173,462 B1 | 2/2007 | Wang | |
| 7,389,905 B2 | 6/2008 | Reiber | |
| 7,676,012 B1 * | 3/2010 | Venugopal et al. | 375/376 |
| 2003/0039330 A1 | 2/2003 | Castiglione et al. | |
| 2004/0136440 A1 | 7/2004 | Miyata et al. | |
| 2006/0056490 A1 * | 3/2006 | Chen et al. | 375/130 |
| 2006/0146971 A1 * | 7/2006 | Kaizuka | 375/376 |
| 2006/0290393 A1 | 12/2006 | Yamamoto et al. | |
| 2007/0019711 A1 | 1/2007 | Mallinson et al. | |
| 2007/0252737 A1 * | 11/2007 | Eikenbroek | 341/143 |
| 2008/0100365 A1 | 5/2008 | Kaizuka | |
| 2009/0072913 A1 * | 3/2009 | Eikenbroek | 331/18 |

FOREIGN PATENT DOCUMENTS

| | | |
|---|---|---|
| EP | 1612946 | 1/2006 |
| WO | WO 2004/088846 | 10/2004 |
| WO | WO 2006/002844 | 1/2006 |

OTHER PUBLICATIONS

Office Action dated May 12, 2011, issued in parent U.S. Appl. No. 11/940,486.
Final Office Action mailed Nov. 28, 2011, in U.S. Appl. No. 11/940,486.

* cited by examiner

*Primary Examiner* — Zewdu Kassa
(74) *Attorney, Agent, or Firm* — McClure, Qualey & Rodack, LLP

(57) ABSTRACT

Clock generators are provided. A phase locked loop generates an output clock, a delay line is coupled to an input of the phase locked loop, and a modulation unit integrates an input signal with a constant level to generate a modulation signal controlling the delay line, thereby modulating a phase of a first input clock of the phase locked loop, such that frequency of the output clock is locked at a desired frequency.

16 Claims, 11 Drawing Sheets

CLOCK GENERATORS AND CLOCK GENERATION METHODS THEREOF

CROSS REFERENCE TO RELATED APPLICATIONS

This application is a Continuation-In-Part of pending U.S. patent application Ser. No. 11/940,486, filed Nov. 15, 2007 and entitled "SPREAD SPECTRUM CLOCK GENERATORS".

RADICALS".BACKGROUND OF THE INVENTION

1. Field of the Invention

The invention relates to clock generators and clock generation methods thereof.

2. Description of the Related Art

Conventional EMI (Electronic Magnetic Interference) prevention measures include EMI filters, ferrite beads, chokes, adding power layer and ground plane to board, metal shielding, special coatings, and RF gaskets. However, a principle source of EMI is system clocks, including frequency timing generators, crystal oscillators, voltage controlled oscillators (VCOs) and phase locked loops (PLLs). An efficient and economical method of reducing EMI for an entire system is to use low-EMI spread spectrum clock (SSC) oscillators. The advantages of using low EMI oscillators are compliance with regulatory testing, short time-to-market, and cost reduction.

BRIEF SUMMARY OF THE INVENTION

A detailed description is given in the following embodiments with reference to the accompanying drawings.

Embodiments of a clock generator are provided, in which a phase locked loop generates an output clock, a delay line is coupled to an input of the phase locked loop, and a modulation unit integrates an input signal with a constant level to generate a modulation signal controlling the delay line, thereby modulating a phase of a first input clock of the phase locked loop, such that frequency of the output clock is locked at a desired frequency.

The invention also provides another embodiment of a clock generator, in which a phase locked loop generates an output clock according to a first input clock and a second input clock, a frequency divider divides the output clock to generate a divided output clock according to a first control signal, and a delay line modulates a phase of one of the first and second input clocks according to a second control signal, wherein the delay line and the frequency divider are controlled to perform a frequency division to the output clock by a fractional division factor, according to the first and second control signals.

The invention also provides another embodiment of a clock generator, in which a modulation unit integrates an input signal with a constant level to generate the first control signal and the second control signal, and a phase locked loop generates an output clock according to a first input clock and a second input clock. A frequency divider divides the output clock to generate a divided output clock according to the first control signal, and a delay line modulates a phase of the divided output clock to output the modulated and divided output clock serving as the second input clock according to the second control signal, such that frequency of the output clock is locked at a desired frequency. According to the first and second control signals, the delay line and the frequency divider are controlled to perform a frequency division to the output clock by a fractional division factor.

The invention also provides another embodiment of a clock generator, in which a modulation unit integrates an input signal with a constant level to generate the first control signal and the second control signal, a phase locked loop generates an output clock, and a delay line modulates a phase of a first input clock of the phase locked loop to output the modulated clock according to the second control signal. A frequency divider divides the output clock to generate a second input clock according to the first control signal, such that the phase locked loop generates the output clock and frequency of the output clock is locked at a desired frequency according to the modulated clock and the second input clock. The delay line and the frequency divider are controlled to perform a frequency division to the output clock by a fractional division factor, according to the first and second control signals.

The invention also provides an embodiment of a clock generation method, in which a modulation signal is provided, and an output clock of a phase clocked loop is divided according to the modulation signal. Phase of a first input clock of the phase locked loop or that of the divided output clock is modulated according to the modulation signal, such that the output clock is divided by a fractional division factor, wherein the divided output clock serves as a second input clock of the phase locked loop when the phase of the first input clock is modulated, or the modulated and divided output clock serves as the second input clock of the phase locked loop when the phase of the divided output clock is modulated.

The invention also provides an embodiment of a clock generation method, in which an input signal with a constant level is integrated to generate a modulation signal, and an output clock of a phase clocked loop is divided according to the modulation signal. Phase of a first input clock of the phase locked loop or that of the divided output clock is modulated according to the modulation signal, such that frequency of the output clock is locked at a desired frequency.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
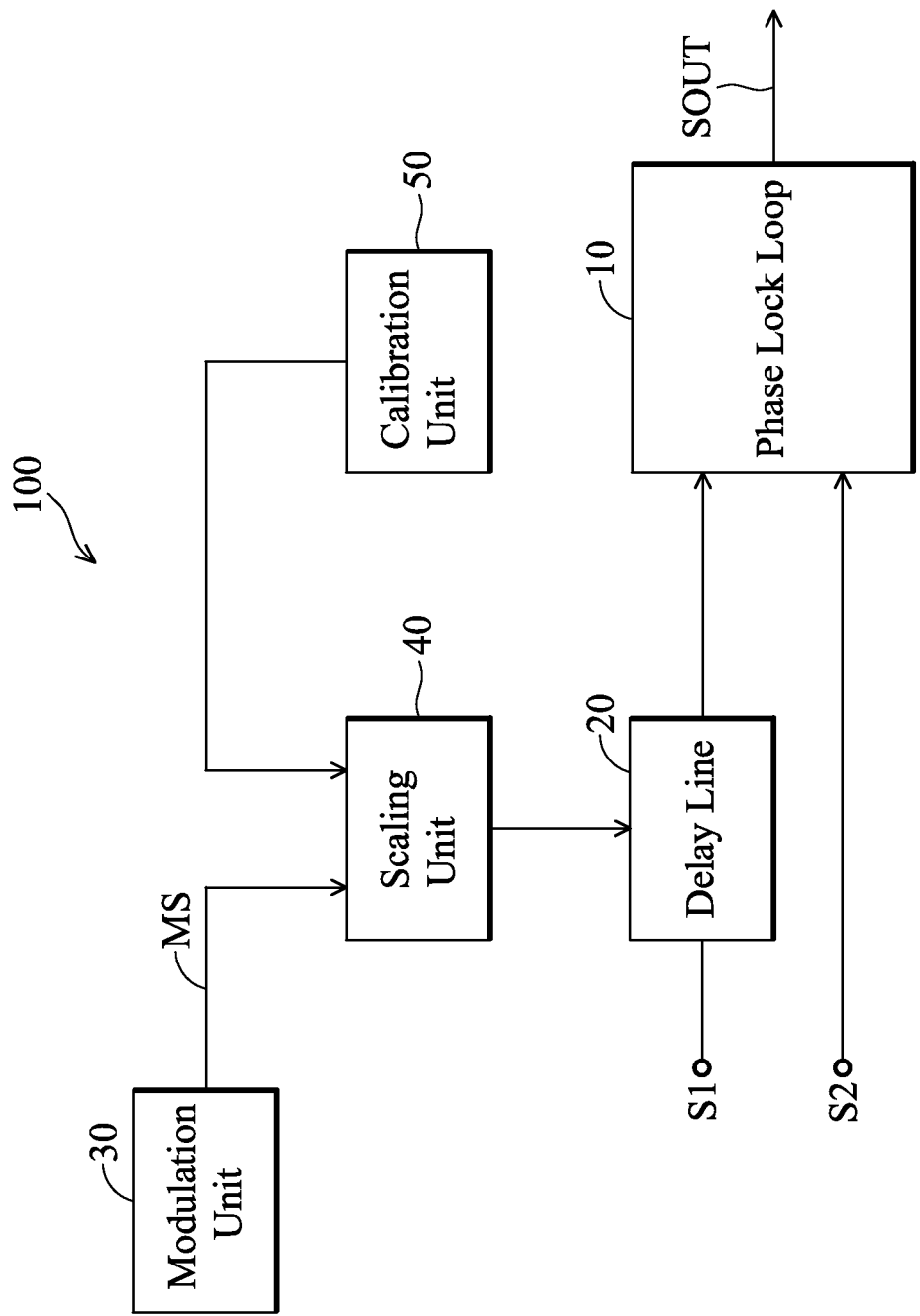
FIG. 1 shows an embodiment of a spread spectrum clock generator.

FIG. 1 shows an embodiment of a spread spectrum clock generator. As shown, the spread spectrum clock generator comprises a phase locked loop 10, a delay line 20, a modulation unit 30, a scaling unit 40, and a calibration unit 50.

The phase locked loop 10 generates an output clock SOUT according to a first input clock S1 and a second input clock S2. For example, the phase locked loop 10 can comprises a phase/frequency detector, a charge pump, a low-pass filter and a voltage controlled oscillator (VCO). The phase/frequency detector detects the phase shift between the first and second input clocks S1 and S2 and outputs a pump-up signal or a pump-down signal to control the charge pump. Voltage generated by the charge pump is filtered by the low-pass filter and supplied to the VCO as its reference voltage. Based on the reference voltage, the VCO generates a clock signal. The VCO may be any circuit that generates clock frequency signals in response to an input reference voltage. In general, a ring oscillator may be a typical VCO structure. Since the structure of the phase locked loop 10 is known in the art, detailed description thereof is omitted.

For example, the first input clock S1 can be provided by a crystal oscillator and the second input clock S2 can be provided by a frequency divider according to the output clock SOUT of the phase locked loop 10. Alternately, the first input clock S1 can be provided by a frequency divider according to the output clock of the phase locked loop 10 and the second input clock S2 can be provided by a crystal oscillator.

Since phase difference between the first and second input clocks S1 and S2 causes variation in frequency of the output clock SOUT, the relationship between the frequency of the output clock SOUT and the phase difference between the first and second input clocks S1 and S2 can be regarded as $$f = \frac{d\Phi}{dt}.$$

Hence, the invention generates a spread spectrum clock by modulating the phase of the first input clock S1. Namely, the modulation unit 10 provides a modulation signal MS to control the delay line 20 coupled between the first input clock S1 and the phase locked loop 10, thereby modulating a phase of the first input clock S1, such that frequency of the output clock SOUT generated by the phase locked loop 10 varies periodically.

For example, the delay line 20 can be a digital delay line or an analog delay locked loop (DLL), but is not limited thereto. Further, a scaling unit 40 can be disposed between the delay line 20 and the modulation unit 30 to scale the modulation signal MS, with a calibration unit 50 adjusting a scale ratio of the scaling unit 40.

Figure 2A:
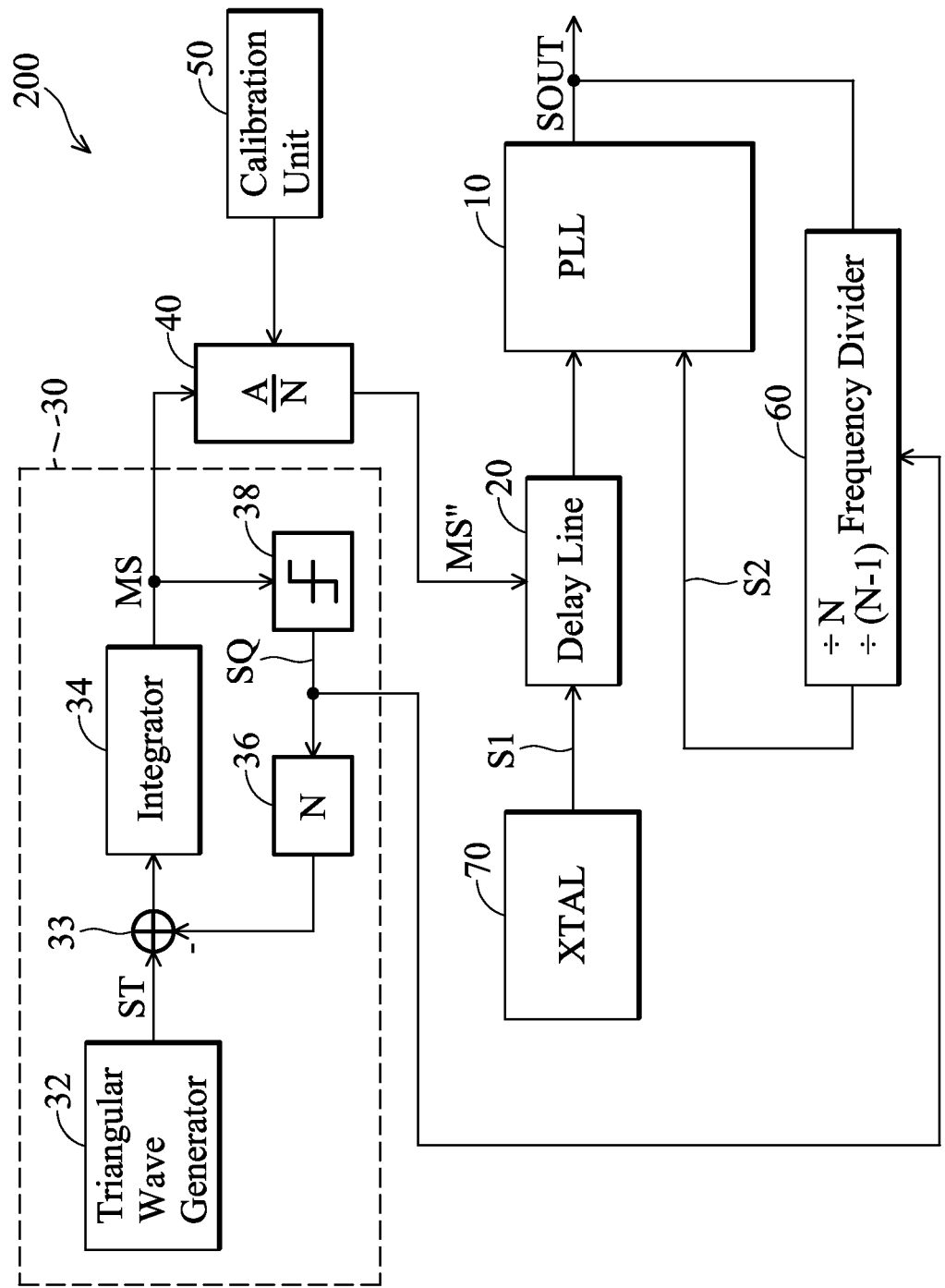
FIG. 2A shows another embodiment of a spread spectrum clock generator.

FIG. 2A shows another embodiment of a spread spectrum clock generator. As shown, the spread spectrum clock generator 200 differs from that in FIG. 1 only in the phase locked loop 10, the delay line 20, the scaling unit 40 and the calibration unit 50. In this embodiment, the first input clock S1 is provided by a crystal oscillator 70, and the second input clock S2 is provided by the frequency divider 60 in response to the output clock SOUT of the phase locked loop 10.

Figure 2B:
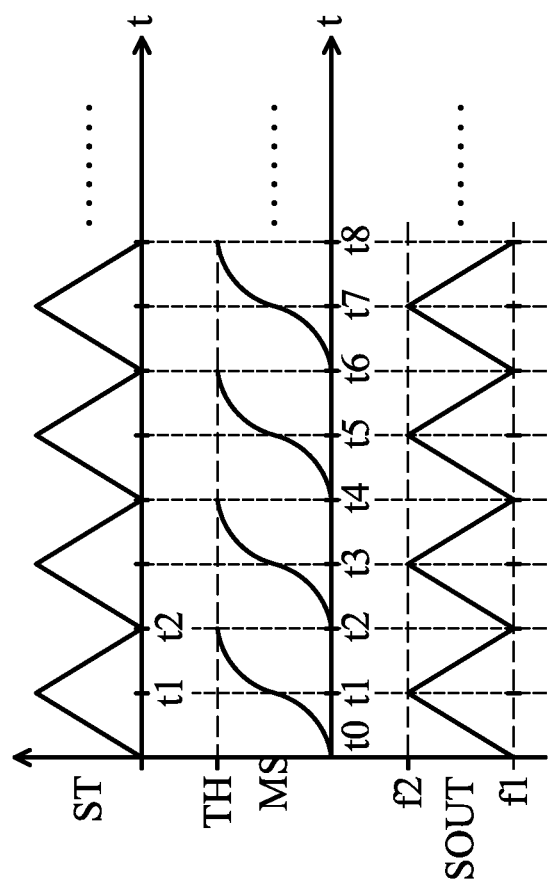
FIG. 2B shows an embodiment of a delay line.

The modulation unit 30 comprises a triangular wave generator 32, a subtractor 33, an integrator 34, a quantizer 38 and a scaling unit 36. The triangular wave generator 32 generates a triangular wave signal ST as shown in FIG. 2B output to the integrator 34 through subtractor 33. The triangular wave generator 32, can, for example, be an up-down counter but is not limited thereto. The quantizer 38 generates a value SQ of "0" or "1" according to the modulation signal MS (the integrated triangular wave signal). For example, when the modulation signal MS reaches a threshold value TH, the quantizer 38 generates a value SQ of "1", and when the modulation signal MS does not reach the threshold value TH, the quantizer 38 generates a value SQ of "0".

The scaling unit 36 scales the value SQ generated by the quantizer 38 for output to the subtractor 33. For example, when the quantizer 38 generates the value SQ of "1" because the modulation signal MS reaches threshold value TH, the scaling unit 36 scales the value SQ and outputs the value SQ to the subtractor 33. Hence, the subtractor 33 subtracts the scaled value from the integration signal MS of the integrator 34, such that the integration signal MS is reset and becomes zero accordingly. As shown in FIG. 2B, the modulation signal MS is reset by the scaled value output from the scaling unit 36 at time t2, t4, t6 and t8 and so on. Further, when the modulation signal MS is reset (becomes zero), the quantizer 38 generates a value SQ of "0" until the modulation signal reaches the threshold value TH again. Hence, the triangular wave signal ST from the triangular wave generator 32 is integrated into the threshold value TH from zero repeatedly, as shown in FIG. 2B to serve as the modulation signal MS. The subtractor 33, the integrator 34, quantizer 38 and the scaling unit 36 are connected to form a feedback loop, such that the triangular wave signal ST is integrated as the modulation signal MS as shown in FIG. 2B.

The modulation signal MS output from the integrator 34 is then scaled by the scaling unit 40 and output to the delay line 20. The delay line 20 modulates the phase of the first input clock S1 according to the scaled modulation signal MS", such that frequency of the output clock SOUT generated by the phase locked loop 10 varies periodically. As an example, frequency of the output clock SOUT generated by the phase locked loop 10 varies between f1 and f2, in a triangular wave, as shown in FIG. 2B.

When the phase of one input clock leads that of the other input clock of a phase locked loop, the phase/frequency detector outputs a pump-up signal to control the charge pump, increasing the frequency of the output clock thereof. On the contrary, when the phase of the input clock lags behind that of the other input clock, the phase/frequency detector outputs a pump-down signal to control the charge pump, decreasing the frequency of the output clock of the PLL.

Figure 2C:
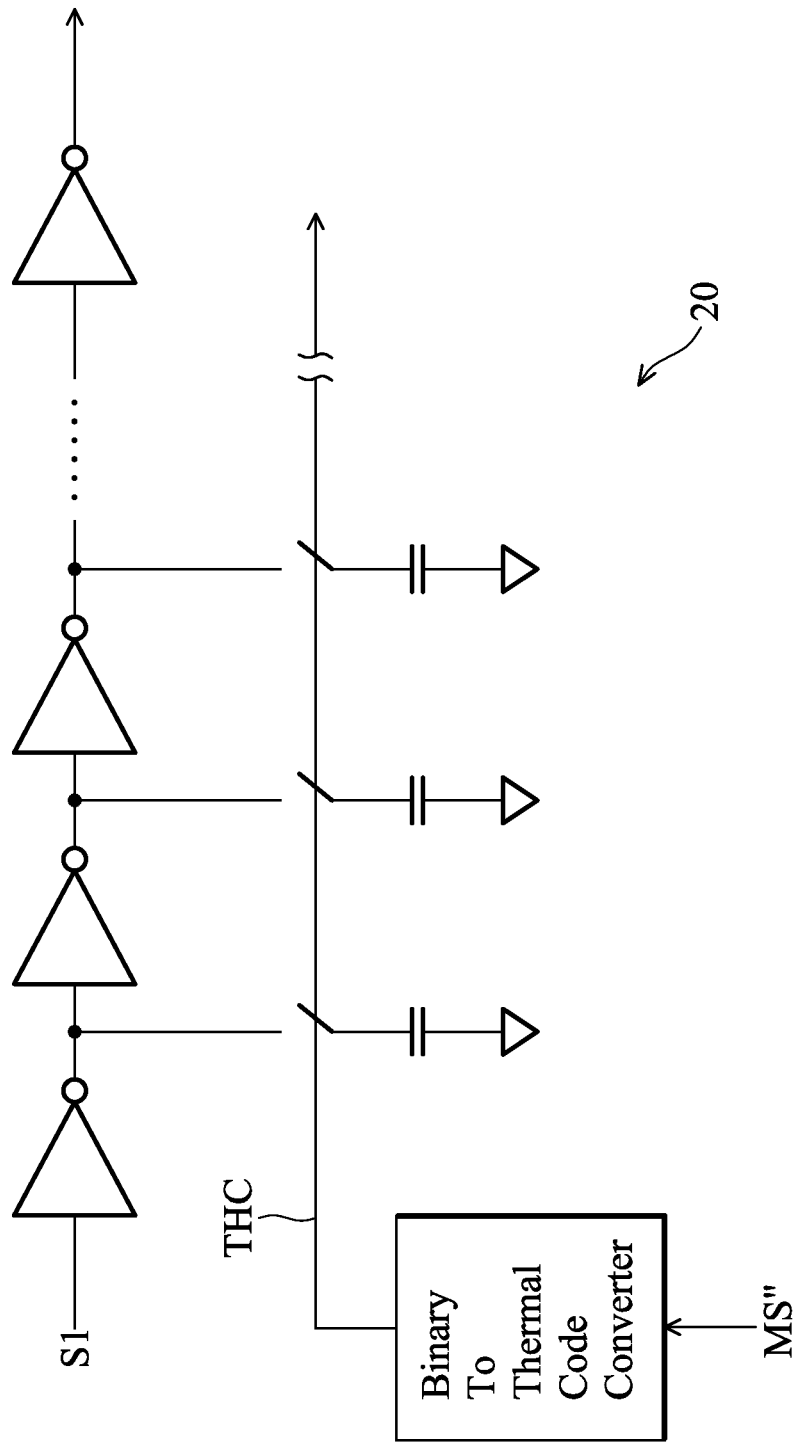
FIG. 2C shows a wave diagram of the spread spectrum clock generator shown in FIG. 2A.

In this embodiment, the delay unit 20 comprises a binary to thermal code converter, a plurality of inverters connected in series, a plurality of switching elements coupled to the inverters, and a plurality of capacitors each coupled between a corresponding switching element and ground, as shown in FIG. 2C. The binary to thermal code converter converts the scaled modulation signal MS" to a control (thermal) code THC to switch the switching elements, changing the phase of the first input clock S1. Namely, a phase variation between the modulated first input clock and the original first input clock S1 provided by the crystal oscillator 70 depends on the scaled modulation signal MS" shown in FIG. 2B In the initial state, the switching elements can, for example, be all turned on and the first and second input clocks S1 and S2 have the same phase. Once one or more of the switching elements is turned off, the phase of the first input clock S1 abruptly leads the second input clock S2 because the number of charged capacitors is decreased. Hence, the frequency of the output clock SOUT is increased accordingly. Further, if the accumulated phase difference, which the first input clocks S1 leads the second input clock S2, exceeds half period of the second input clock S2, it can be regarded as the second input clock S2 leads the first input clock S1 and thus, the frequency of the output clock SOUT is decreased accordingly.

For example, the switching elements in the delay line 20 of the embodiment can be turned off by parts according to the scaled modulation signal MS" until all are turned off or the accumulated delay time reaches a predetermined level. Hence, the frequency of the output clock SOUT is increased as the switching elements are turned off progressively until the accumulated phase difference exceeds half period of the second input clock S2 at time t1 and is then decreased after time t1 until all switching elements are turned off at time t2. Similarly, the frequency of the output clock SOUT is increased at time t2 and is then decreased after time t3 until time t4, and so on.

Due to limitation of physical elements, it is impossible to utilize a delay line with infinite length in practice. Thus, the embodiment skips cycles of the output clock SOUT by the frequency divider 60 and resets the delay line 20 when the delay line 20 is not able to delay the first input clock S1 anymore. In this embodiment, the frequency divider 60 has a first operating mode dividing the second input clock S2 by a division factor of 30 and a second operating mode dividing the second input clock S2 by a division factor of 29, and the operating modes are switched according to the modulation signal MS.

For example, when the modulation signal MS reaches the threshold value TH, the quantizer 38 outputs the value SQ of "1" to the scaling unit 36 and the frequency divider 60, such that the scaling unit 36 outputs the scaled value to reset the modulation signal MS (by the subtractor 33). Meanwhile, the frequency divider 60 is enabled to enter the second operating mode from the first operating mode. Hence, the output clock SOUT from the phase locked loop 10 is divided by the division factor of 29 at time t2 and one period (1T) of the output clock SOUT is skipped.

If the default delay period of the delay line 20 is assumed to be one period (1T) of the output clock SOUT, the output clock SOUT is skipped by one period, such that the timing of the first and second input clocks S1 and S2 can match. It should be noted that the number of cycles skipped is related to division factors. For example, when the default delay period of the delay line 20 is assumed as two periods (2T) of the output clock SOUT, the output clock SOUT can be divided by the division factor of 28 from the division factor of 30, two periods (2T) of the output clock SOUT are skipped, and so on.

The calibration unit 50 adjusts a scale ratio of the scaling unit 40 in order to match the real delay period of the delay line 20 to the skipped cycle. For example, if the real delay period is less than the default, the calibration unit 50 increases the scale ratio of the scaling unit 40. On the contrary, if the real delay period exceeds the default, the calibration unit 50 lowers the scale ratio of the scaling unit 40. Namely, the calibration unit 50 adjusts the scale ratio of the scaling unit 40 such that the real delay period and default delay period of the delay line 20 are matched to the skipped cycles.

Figure 3A:
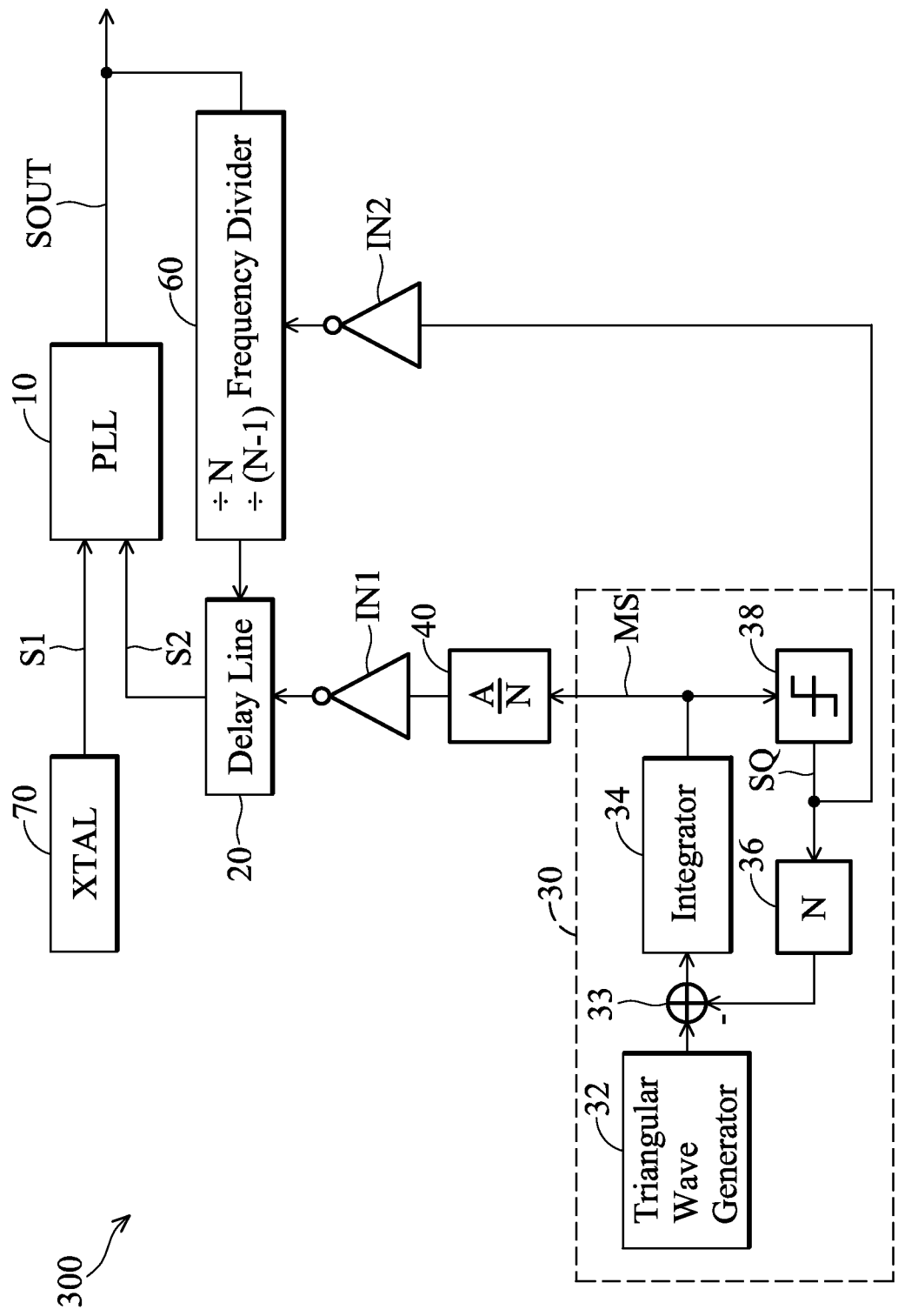
FIG. 3A shows another embodiment of a spread spectrum clock generator.
Figure 3B:
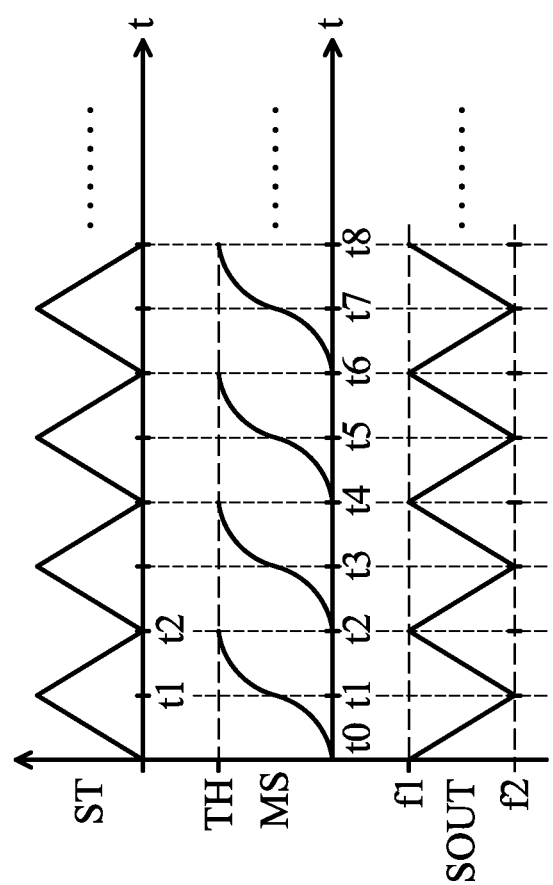
FIG. 3B is a wave diagram of the spread spectrum clock generator shown in FIG. 3A.

FIG. 3A shows another embodiment of a spread spectrum clock generator 300 differing from the spread spectrum clock generator 200 shown in FIG. 2A only in that the delay line 20 is coupled between the phase locked loop 10 and the frequency divider 60 to modulate the second input clock S2 and two inverters INV1 and INV2 coupled between the delay line 20 and the modulation unit 30 and between the frequency divider 60 and the modulation unit 30. Similar structures and operations between the embodiments are omitted for simplification. It should be noted that the output clock SOUT of the phase locked loop 10 in the spread spectrum clock generator 300 is shown in FIG. 3B and is inverse to that of the spread spectrum clock generator 200.

Figure 4:
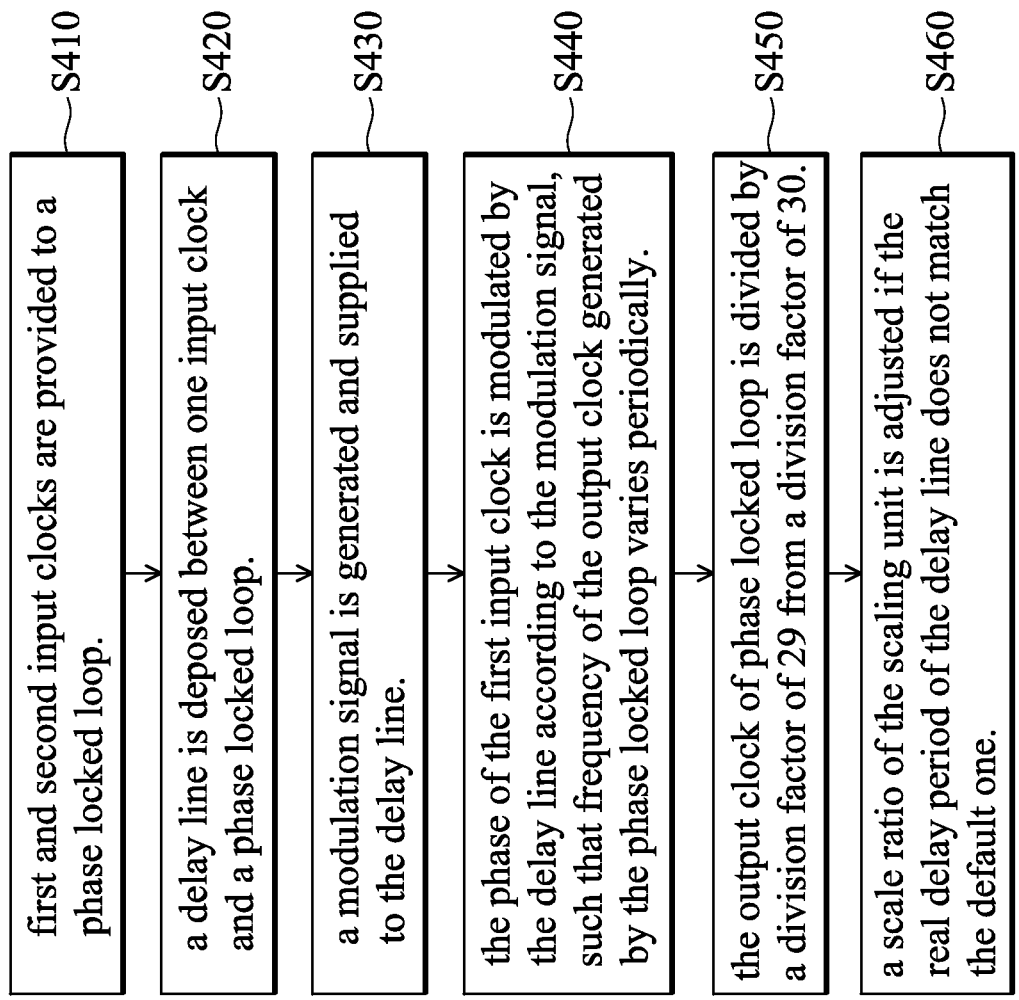
FIG. 4 is a flowchart of a method for generating spread spectrum clock signals.

FIG. 4 shows a flowchart of a method for generating spread spectrum clock signals.

In step S410, first and second input clocks are provided to a phase locked loop. For example, the first input clock S1 is provided by a crystal oscillator 70 and the second input clock S2 can be provided by the frequency divider 60 as shown in FIGS. 2A and 3A. In this embodiment, the frequency divider 60 has a first operating mode dividing the second input clock S2 by a division factor of 30 and a second operating mode dividing the second input clock S2 by a division factor of 29.

In step S420, a delay line is disposed between one input clock and a phase locked loop. For example, the delay line 20 can be coupled to the phase locked loop 10 to modulate the first input clock S1 provided by a crystal oscillator 70 as shown in FIG. 2A or the second input clock S2 provided by frequency divider 60 as shown in FIG. 3A. For example, the delay unit 20 can comprises a binary to thermal code converter, a plurality of inverters connected in series, a plurality of switching elements coupled to the inverters, and a plurality of capacitors each coupled between a corresponding switching element and ground, as shown in FIG. 2C.

In step S430, a modulation signal is generated and supplied to the delay line. For example, the modulation signal MS can be generated by the modulation unit 30 and supplied to the delay line 20. In the modulation unit 30, a triangular wave signal ST is generated by a triangular wave generator 32 and supplied to an integrator 34, and the integrated triangular signal serves as the modulation signal MS. The modulation signal MS is supplied to the scaling unit 40 and the scaled modulation signal MS" is supplied to the delay line 20. In some embodiments, the modulation signal MS can be directly supplied to the delay line 20 without scaling by the scaling unit 40.

Further, the modulation signal MS is also supplied to the quantizer 38 which outputs a value SQ to the scaling unit 36 and the frequency divider 60 according to the received modulation signal MS. For example, when the modulation signal MS reaches a threshold value TH, the quantizer 38 generates a value SQ of "1", the value SQ of 1 is scaled by the scaling unit 36 and outputs it to the subtractor 33. Hence, the subtractor 33 subtracts the scaled value from the modulation signal MS of the integrator 34, such that the modulation signal MS is reset and becomes zero accordingly. As shown in FIG. 2B, the modulation signal MS is reset by the scaled value output from the scaling unit 36 at time t2, t4, t6 and t8 and so on.

Moreover, when the modulation signal MS is reset (becomes zero) and below the threshold value TH, the quantizer 38 generates a value SQ of "0" until the modulation signal reaches the threshold value TH again. Hence, the triangular wave signal ST from the triangular wave generator 32 would be integrated to the threshold value TH from zero again and again as shown in FIG. 2B to serve as the modulation signal MS. Namely, the subtractor 33, the integrator 34, quantizer 38 and the scaling unit 36 are connected to form a feedback loop, such that the triangular wave signal ST is integrated as the modulation signal MS as shown in FIG. 2B.

In step S440, the phase of the first input clock is modulated by the delay line according to the modulation signal, such that frequency of the output clock generated by the phase locked loop varies periodically. The delay line 20 modulates the phase of the first input clock S1 according to the scaled modulation signal MS" from the scaling unit 40, but is not limited thereto. In some embodiments, the delay line 20 can also modulate the phase of the first input clock S1 according to the modulation signal MS from the integrator 34 without scaling by the scaling unit 40.

For example, the binary to thermal code converter in FIG. 2C can convert the scaled modulation signal MS" to a control (thermal) code THC to switch the switching elements, changing the phase of the first input clock S1. The switching elements can be all turned on and the first and second input clocks S1 and S2 have the same phase in the initial state. When one or more of the switching elements is turned off, the phase of the first input clock S1 abruptly leads the second input clock S2 because the charged capacitors are decreased. Hence, the frequency of the output clock SOUT is increased accordingly. Further, as the accumulated phase difference, with which the first input clocks S1 leads the second input clock S2, exceeds half period of the second input clock S2, it can be regarded as the second input clock S2 leads the first input clock S1 and thus, the frequency of the output clock SOUT is decreased accordingly.

In this embodiment, the switching elements in the delay line 20 can be turned off by parts according to the scaled modulation signal MS" until all are turned off. Hence, the frequency of the output clock SOUT is increased as the switching elements are turned off progressively until the accumulated phase difference exceeds half period of the second input clock S2 at time t1 and is then decreased after time t1 until all switching elements are turned off at time t2. Namely, the frequency of the output clock SOUT of the phase locked loop 10 can be varied between f1 and f2 as a triangular wave as shown in FIGS. 2C and 3B.

In step S450, the output clock of phase locked loop is divided by a division factor of 29 from a division factor of 30. Due to limitations in physical elements, it is impossible to utilize a delay line with infinite length in practice. Thus, the embodiment skips cycles of the output clock SOUT by the frequency divider 60 and resets the delay line 20 when the delay line 20 is not able to delay the first input clock S1 anymore.

For example, when the modulation signal MS reaches the threshold value TH, the quantizer 38 outputs the value SQ of "1" to the scaling unit 36 and the frequency divider 60. Accordingly, the scaled value output from the scaling unit 36 resets the modulation signal MS by the subtractor 33 and enables the frequency divider 60 to enter the second operating mode from the first operating mode. Hence, the output clock SOUT from the phase locked loop 10 is divided by the division factor of 29 at time t2 such that one period (1T) of the output clock SOUT is skipped.

If the default delay period of the delay line 20 is assumed to be a period of the output clock SOUT, the output clock SOUT is skipped by one period (1T), such that the timing the first and second input clocks S1 and S2 can match.

In step S460, a scale ratio of the scaling unit 40 is adjusted if the real delay period of the delay line 20 does not match the default. For example, if real delay period is less than the default, the calibration unit 50 increases the scale ratio of the scaling unit 40. On the contrary, if real delay period exceeds the default, the calibration unit 50 lowers the scale ratio of the scaling unit 40.

It should be noted that the number of cycles skipped is related to the division factors. For example, when the default delay period of the delay line 20 is assumed as two periods (2T) of the output clock SOUT, the output clock SOUT can be divided by the division factor of 28 from the division factor of 30, two periods (2T) of the output clock SOUT are skipped, and so on. In this case, the calibration unit 50 adjusts the scale ratio of the scaling unit 40 such that the real delay period of the delay line 20 is 2T.

In the invention, the phase of the input clock S1 is modulated by the modulation signal, such that the frequency of the output clock SOUT is varied periodically (between f1 and f2) as shown in FIGS. 2B and 3B. Namely, the spread spectrum clock generator 200 and 300 can generate spread clock signals by modulating the phase of the phase locked loop. Further, the invention skips cycles of the output clock by the frequency divider when the delay line no longer delays the input clock, and thus, only a delay line with a predetermined delay period is required while one with infinite length is not required.

As shown in FIG. 2B, the frequency of the output clock SOUT is increased from frequency f1 to f2 as the amplitude of the triangular wave signal ST increases from time t0 to t1, and the frequency of the output clock SOUT is then decreased from frequency f2 to t1 as the amplitude of the triangular wave signal ST is decreased from time t1 to t2, and the frequency of the output clock SOUT is increased from frequency f1 to f2 as the amplitude of the triangular wave signal ST increases from time t2 to t3, and the frequency of the output clock SOUT is then decreased from frequency f2 to t1 as the amplitude of the triangular wave signal ST is decreased from time t3 to t4, and so on. As shown in FIG. 3B, the frequency of the output clock SOUT is decreased from frequency f1 to f2 as the amplitude of the triangular wave signal ST increases from time t0 to t1, and the frequency of the output clock SOUT is then increased from frequency f2 to f1 as the amplitude of the triangular wave signal ST is decreased from time t1 to t2, and the frequency of the output clock SOUT is decreased from frequency f1 to f2 as the amplitude of the triangular wave signal ST increases from time t2 to t3, and the frequency of the output clock SOUT is then increased from frequency f2 to f1 as the amplitude of the triangular wave signal ST is decreased from time t3 to t4, and so on.

In view of this, the relationship between the frequency of the output clock SOUT and the amplitude of the triangular wave signal ST can be represented as fout=f1×(1±Ad), in which fout represents the frequency of the output clock SOUT, and Ad represents the amplitude of the triangular wave signal ST. Namely, frequency of the output clock SOUT generated by the phase locked loop 10 varies along with variations in the amplitude Ad of the triangular wave signal ST provided by the triangular wave generator 32. Hence, the frequency of the output clock SOUT can be maintained at frequency f1 as the amplitude of the triangular wave signal ST is maintained at zero. Under such conception, the spread spectrum clock generators shown in FIGS. 2A and 3A can also be modified to serve as normal clock generators providing clock signals locked at a frequency, and detailed description thereof is given hereinafter.

Figure 5:
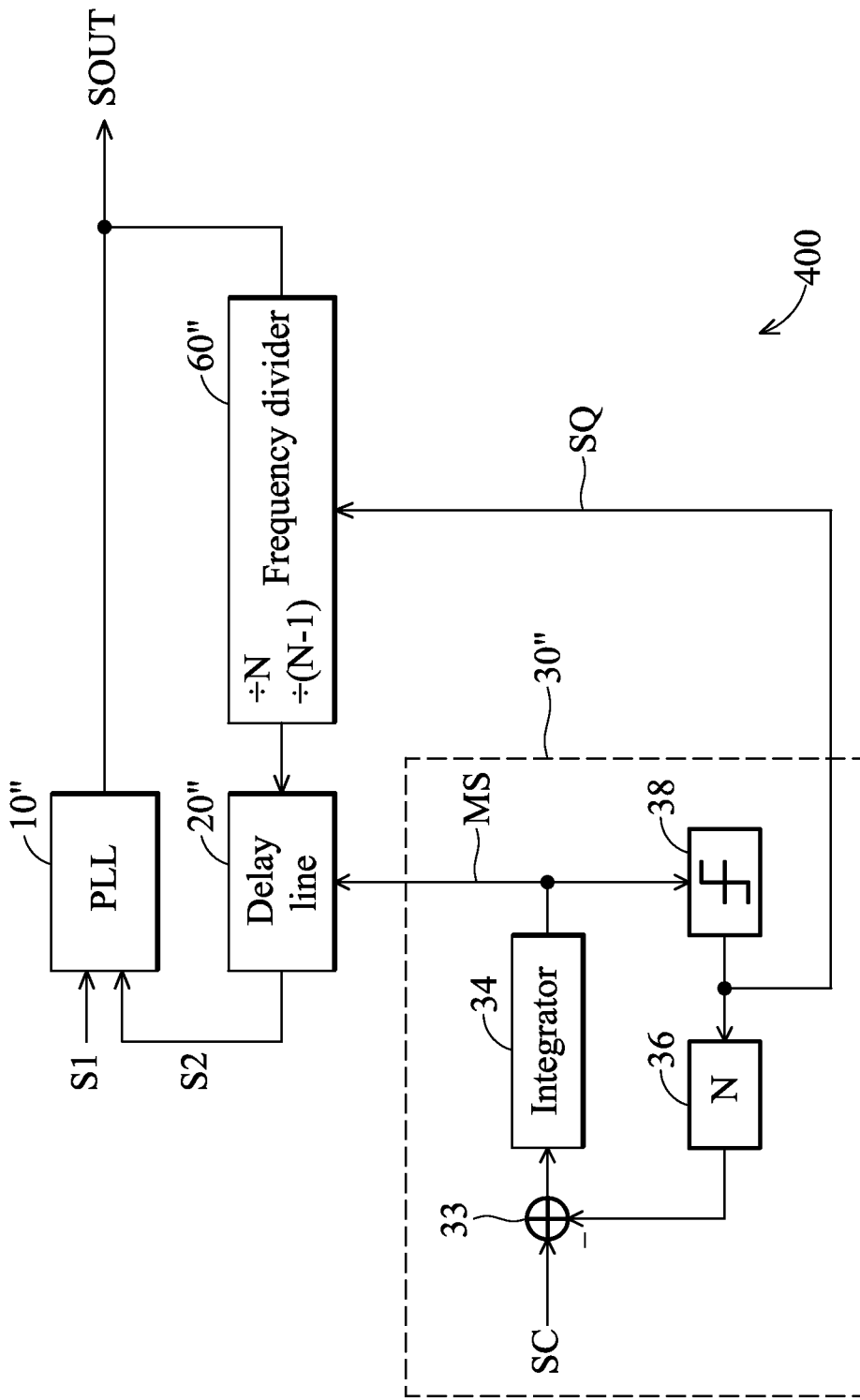
FIG. 5 shows an embodiment of a clock generator.

FIG. 5 shows an embodiment of a clock generator 400 according to the invention. As shown, the clock generator 400 comprises a phase locked loop 10", a delay line 20", a modulation unit 30" and a frequency divider 60". The phase locked loop 10" generates an output clock SOUT according to a first input clock S1, which may come from a crystal oscillator and a second input clock S2 from the delay line 20". The phase locked loop 10" is similar to the phase locked loop 10 shown in FIG. 2A and the structure of the phase locked loop 10" is known in the art, thus detailed description thereof is omitted. The delay line 20" is coupled between one input of the phase locked loop 10" and the frequency divider 60". The delay line 20" modulates the phase of the divided output clock from the frequency divider 60" according to the modulation signal MS and outputs the modulated clock to the phase locked loop 10". The delay line 20" can, for example, be a digital delay line or an analog delay locked loop (DLL), but is not limited thereto.

Figure 6:
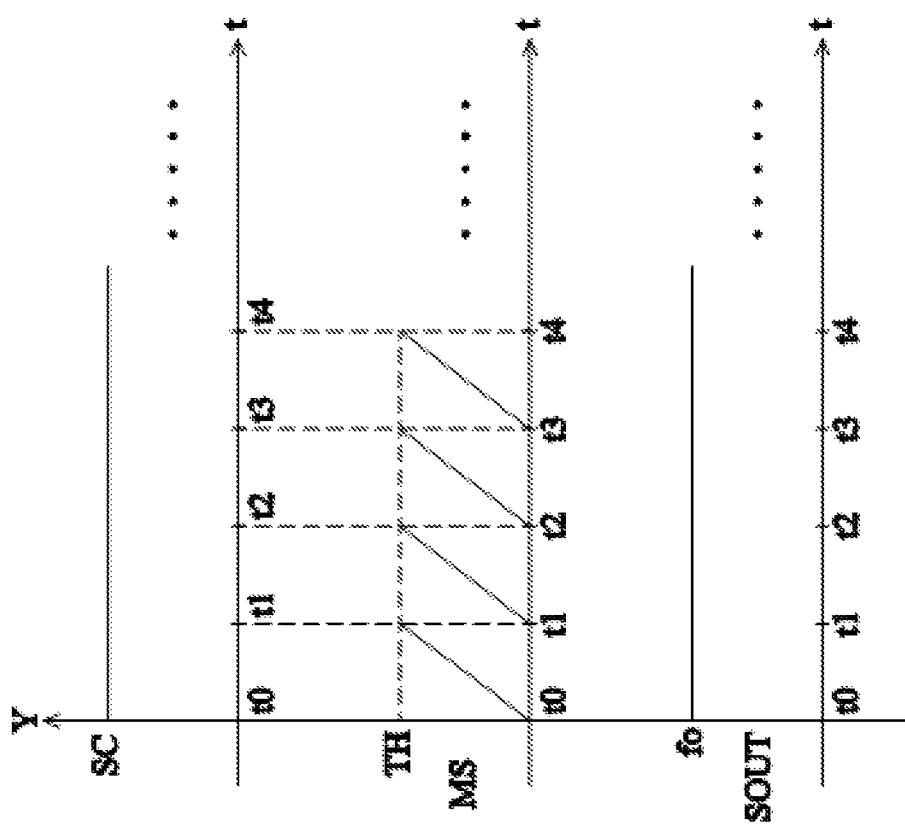
FIG. 6 is a wave diagram of the clock generator shown in FIG. 6.

The modulation unit 30" may be similar to the modulator unit 30 shown in FIGS. 2A and 3A, differing in that the triangular wave generator 30 is omitted, and the modulation unit 30" generates the modulation signal MS according to an input signal SC with a constant level as shown in FIG. 6 rather the triangular wave signal ST shown in FIGS. 2B and 3B. The input signal SC can also be regarded as a signal without amplitude, but is not limited thereto. The modulation unit 30" comprises the subtractor 33, the integrator 34, the scaling unit 36 and the quantizer 38. The input signal SC is output to the integrator 34 through the subtractor 33, and the integrator 34 then integrates the input signal SC. The quantizer 38 generates a value SQ of "0" or "1" according to the modulation signal (i.e., the integrated input signal). For example, when the modulation signal MS reaches a threshold value TH, the quantizer 38 generates a value SQ of "1". On the contrary, the quantizer 38 generates a value SQ of "0" when the modulation signal MS does not reach the threshold value TH.

The scaling unit 36 scales the value SQ generated by the quantizer 38 to output to the subtractor 33. For example, when the quantizer 38 generates the value SQ of "1", because the modulation signal MS reaches the threshold value TH, the scaling unit 36 scales the value SQ and outputs the value SQ to the subtractor 33. Consequently, the subtractor 33 subtracts the scaled value from the integration signal MS of the integrator 34, such that the integration signal MS is reset and becomes zero accordingly. As shown in FIG. 6, the modulation signal MS is reset by the scaled value output from the scaling unit 36 at time t1, t2, t3, t4 and so on. Further, when the modulation signal MS is reset (becomes zero), the quantizer 38 generates a value SQ of "0" until the modulation signal MS reaches the threshold value TH again. Hence, the input signal SC is integrated to the threshold value TH from zero repeatedly as shown in FIG. 6 to serve as the modulation signal MS. Namely, the subtractor 33, the integrator 34, the quantizer 38 and the scaling unit 36 are connected to form a feedback loop, such that the input signal SC with a constant level is integrated as the modulation signal MS as shown in FIG. 6.

The frequency divider 60" selectively divides the output clock SOUT of the phase locked loop 10" by a division factor N or N−1 based on the value SQ generated according to the modulation signal MS. For example, when the modulation signal MS does not reach the threshold value TH, the quantizer 38 outputs the value SQ of "0" to the scaling unit 36 and the frequency divider 60", such that the scaling unit 36 does not reset the modulation signal MS (by the subtractor 33). Meanwhile, the frequency divider 60" is enabled to divide the output clock SOUT by the division factor N−1. On the contrary, when the modulation signal MS reaches the threshold value TH, the quantizer 38 outputs the value SQ of "1" to the scaling unit 36 and the frequency divider 60", such that the scaling unit 36 outputs a scaled value to reset the modulation signal MS (by the subtractor 33). Meanwhile, the frequency divider 60" is enabled to divide the output clock SOUT by the division factor N.

In this embodiment, the frequency divider 60" divides the output clock SOUT according to the value SQ and the delay line 20" modulates the phase of the divided output clock from the frequency divider 60" according to the modulation signal MS, such that the frequency of the output clock SOUT generated by the phase locked loop 10" can be locked at a desired frequency. Namely, the clock generator 400 generates a constant frequency clock rather than a spread spectrum clock. It should be noted that, according to the modulation signal MS and the value SQ from the quantizer 38, the frequency divider 60" and the delay line 20" can be controlled to divide the output clock SOUT by a division factor comprising an integer portion and a decimal portion, in which the integer portion of the division factor is determined by the frequency divider 60" and the decimal portion of the division factor is determined by the delay line 20". Examples that illustrate the frequency divider 60" and the delay line 20" dividing the output clock SOUT by a division factor between 10 and 11 are discussed hereinafter.

Division factor=10.5

Assuming that the output clock SOUT is 100 MHz (i.e., the period of the output clock SOUT is 10 ns), then the frequency divider 60" selectively divides the output clock SOUT by 10 or 11 according to the value SQ. Accordingly, the period of the divided output clock from the frequency divider 60" is 100 ns when the output clock SOUT is divided by 10, and the period of the divided output clock from the frequency divider 60" is 110 ns when the output clock SOUT is divided by 11.

During a first time interval, the frequency divider 60" divides the output clock SOUT by 10, and the delay unit 20" delays the divided output clock from the frequency divider 60" for 5 ns. For example, the frequency divider 60" asserts a first rising edge at time 100 ns when 10 periods of 10 ns have been counted, and the delay unit 20" delays the first rising edge for 5 ns, such that the first rising edge is presented at the input terminal of the phase locked loop 10" at time 105 ns. During a second time interval, the frequency divider 60" divides the output clock SOUT by 11 and the delay unit 20" does not delay the divided output clock from the frequency divider 60". For example, the frequency divider 60" asserts a second rising edge at time 210 ns when 11 periods of 10 ns have been counted after time 100 ns. The second rising edge is presented at the input terminal of the phase locked loop 10" at time 210 ns because the delay unit 20" does not delay the second rising edge.

During a third time interval, the frequency divider 60" divides the output clock SOUT by 10 again and the delay unit 20" delays the divided output clock from the frequency divider 60" for 5 ns again. For example, the frequency divider 60" asserts a third rising edge at time 310 ns when 10 periods of 10 ns have been counted after time 210 ns, and the delay unit 20" delays the third rising edge for 5 ns, such that the third rising edge is presented at the input terminal of the phase locked loop 10" at time 315 ns. During a fourth time interval, the frequency divider 60" divides the output clock SOUT by 11 and the delay unit 20" does not delay the divided output clock from the frequency divider 60". For example, the frequency divider 60" asserts a fourth rising edge at time 420 ns when 11 periods of 10 ns have been counted after time 310 ns. The fourth rising edge is presented at the input terminal of the phase locked loop 10" at time 420 ns because the delay unit 20" does not delay the fourth rising edge. As for the other time intervals, descriptions may be deduced from the previously described time interval descriptions. In this example, the rising edges is presented at the input terminal of the phase locked loop 10" at 105 ns, 210 ns, 315 ns, 420 ns, and so on, i.e., the period of the input clock S2 is 105 ns and the frequency of the input clock S2 is 9.5238 MHz. Thus, the division factor implemented by the delay line 20" and the frequency divider 60" can be regarded as 10.5 because $$\frac{100 \text{ MHz}}{10.5}$$

is equal to 9.5238 MHz.

Division factor=10.1

During a first time interval, the frequency divider 60" divides the output clock SOUT by 10 and the delay unit 20" delays the divided output clock from the frequency divider 60" for 1 ns. For example, the frequency divider 60" asserts a first rising edge at time 100 ns when 10 periods of 10 ns have been counted, and the delay unit 20" delays the first rising edge for 1 ns, such that the first rising edge is presented at the input terminal of the phase locked loop 10" at time 101 ns. During a second time interval, the frequency divider 60" divides the output clock SOUT by 10 and the delay unit 20" delays the divided output clock from the frequency divider 60" for 2 ns. For example, the frequency divider 60" asserts a second rising edge at time 200 ns when 10 periods of 10 ns have been counted after time 100 ns, and the delay unit 20" delays the second rising edge for 2 ns, such that the second rising edge is presented at the input terminal of the phase locked loop 10" at time 202 ns. During a third time interval, the frequency divider 60" divides the output clock SOUT by 10 and the delay unit 20" delays the divided output clock from the frequency divider 60" for 3 ns. For example, the frequency divider 60" asserts a third rising edge at time 300 ns when 10 periods of 10 ns have been counted after time 200 ns, and the delay unit 20" delays the third rising edge for 3 ns, such that the third rising edge is presented at the input terminal of the phase locked loop 10" at time 303 ns.

During a fourth time interval, the frequency divider 60" divides the output clock SOUT by 10 and the delay unit 20" delays the divided output clock from the frequency divider 60" for 4 ns. For example, the frequency divider 60" asserts a fourth rising edge at time 400 ns when 10 periods of 10 ns have been counted after time 300 ns, and the delay unit 20" delays the fourth rising edge for 4 ns, such that the fourth rising edge is presented at the input terminal of the phase locked loop 10" at time 404 ns. During a fifth time interval, the frequency divider 60" divides the output clock SOUT by 10 and the delay unit 20" delays the divided output clock from the frequency divider 60" for 5 ns. For example, the frequency divider 60" asserts a fifth rising edge at time 500 ns when 10 periods of 10 ns have been counted after time 400 ns, and the delay unit 20" delays the fifth rising edge for 5 ns, such that the fifth rising edge is presented at the input terminal of the phase locked loop 10" at time 505 ns. During a sixth time interval, the frequency divider 60" divides the output clock SOUT by 10 and the delay unit 20" delays the divided output clock from the frequency divider 60" for 6 ns. For example, the frequency divider 60" asserts a sixth rising edge at time 600 ns when 10 periods of 10 ns have been counted after time 500 ns, and the delay unit 20" delays the sixth rising edge for 6 ns, such that the sixth rising edge is presented at the input terminal of the phase locked loop 10" at time 606 ns.

During a seventh time interval, the frequency divider 60" divides the output clock SOUT by 10 and the delay unit 20" delays the divided output clock from the frequency divider 60" for 7 ns. For example, the frequency divider 60" asserts a seventh rising edge at time 700 ns when 10 periods of 10 ns have been counted after time 600 ns, and the delay unit 20" delays the seventh rising edge for 7 ns, such that the seventh rising edge is presented at the input terminal of the phase locked loop 10" at time 707 ns. During an eighth time interval, the frequency divider 60" divides the output clock SOUT by 10 and the delay unit 20" delays the divided output clock from the frequency divider 60" for 8 ns. For example, the frequency divider 60" asserts an eighth rising edge at time 800 ns when 10 periods of 10 ns have been counted after time 700 ns, and the delay unit 20" delays the eighth rising edge for 8 ns, such that the eighth rising edge is presented at the input terminal of the phase locked loop 10" at time 808 ns. During a ninth time interval, the frequency divider 60" divides the output clock SOUT by 10 and the delay unit 20" delays the divided output clock from the frequency divider 60" for 9 ns. For example, the frequency divider 60" asserts a ninth rising edge at time 900 ns when 10 periods of 10 ns have been counted after time 800 ns, and the delay unit 20" delays the ninth rising edge for 9 ns, such that the ninth rising edge is presented at the input terminal of the phase locked loop 10" at time 909 ns.

During a tenth time interval, the frequency divider 60" divides the output clock SOUT by 11 and the delay unit 20" does not delay the divided output clock from the frequency divider 60". For example, the frequency divider 60" asserts a tenth rising edge at time 1010 ns when 11 periods of 10 ns have been counted after time 900 ns because the delay unit 20" does not delay the tenth rising edge. As for the other time intervals, descriptions may be deduced from the previously described time interval descriptions. In this example, the rising edges are present at the input terminal of the phase locked loop 10" at 101 ns, 202 ns, 303 ns, 404 ns, 505 ns, 606 ns, 707 ns, 808 ns, 909 ns, 1010 ns, and so on, i.e., the period of the input clock S2 is 101 ns, and the frequency of the input clock S2 is 9.9 MHz. Thus, the division factor implemented by the delay line 20" and the frequency divider 60" can be regarded as 10.1 because $$\frac{100 \text{ MHz}}{10.1}$$

is equal to 9.9 MHz.

In some examples, the division factor implemented by the delay line 20" and the frequency divider 60" can also be 10.2, 10.3, 10.4, 10.6, 10.7, 10.8 or 10.9 according to the modulation signal MS and the value SQ. If N is 12, the division factor implemented by the delay line 20" and the frequency divider 60" can be 11.1, 11.2, 11.3, ..., 11.8 or 11.9 according to the modulation signal MS and the value SQ. If N is 13, the division factor implemented by the delay line 20" and the frequency divider 60" can be 12.1, 12.2, 12.3, ..., 12.8 or 12.9 according to the modulation signal MS and the value SQ, and so on.

Figure 7:
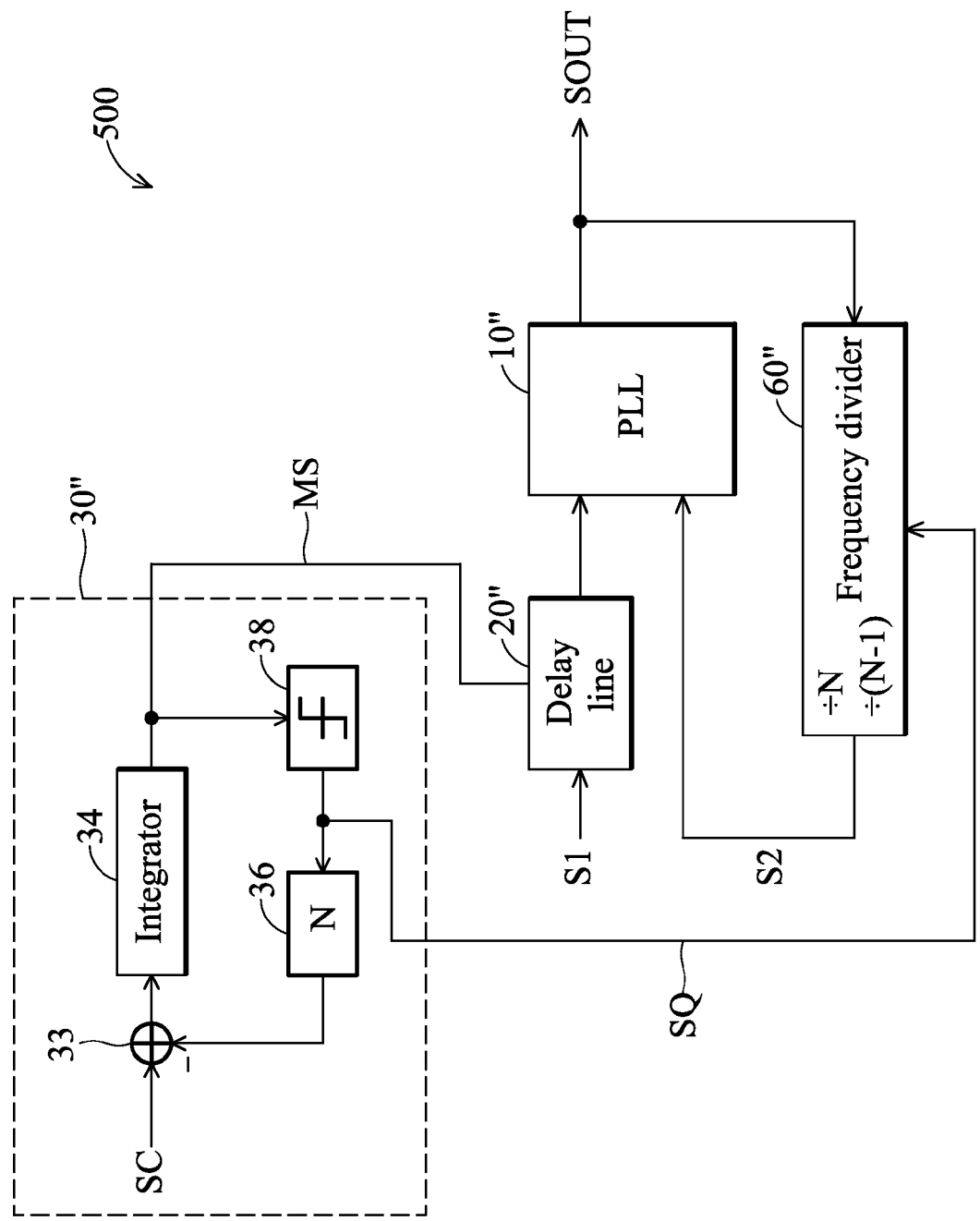
FIG. 7 shows another embodiment of a clock generator.

FIG. 7 shows another embodiment of a clock generator 500 differing from the clock generator 400 shown in FIG. 5 in that the delay line 20" is coupled between the input clock S1 and the input terminal of the phase locked loop 10" rather than the frequency divider 60" and the input terminal of the phase locked loop 10". Similar structures and operations between the embodiments are omitted for simplification.

Because the division factor implemented by the delay line 20" and the frequency divider 60" can be designed to any value according to the modulation signal MS and the value SQ, the frequency of the output clock SOUT of the clock generators shown in FIGS. 5 and 7 can be locked at any desired frequency.

Figure 8:
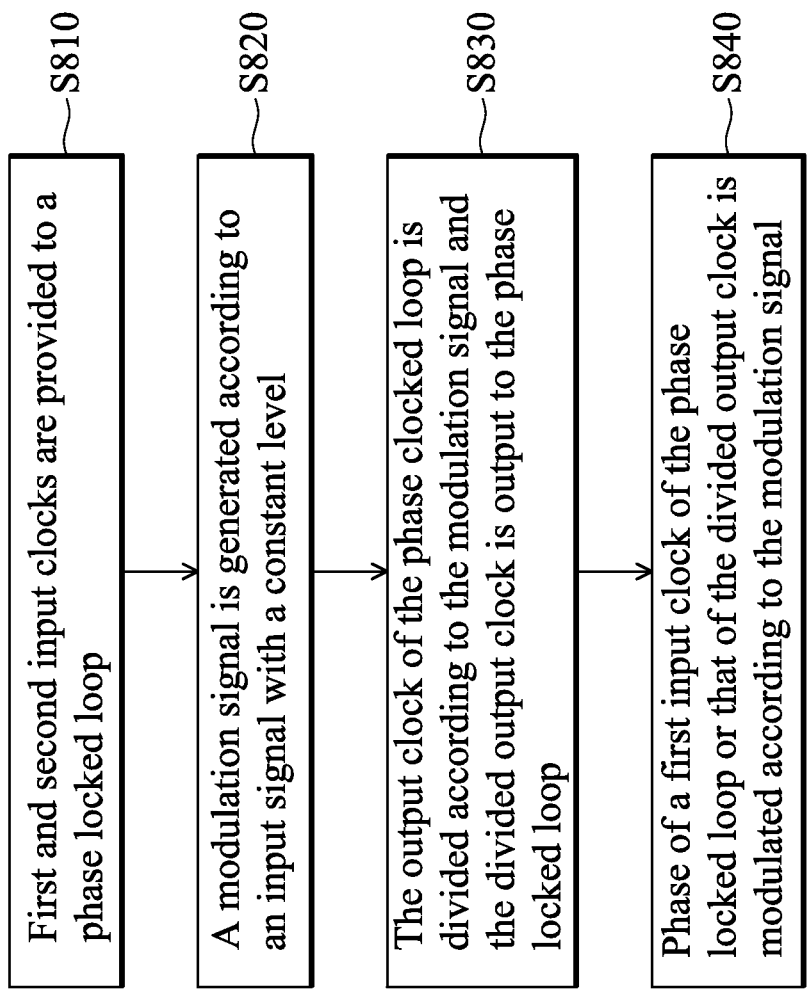
FIG. 8 is a flowchart of a method for generation clock signals.

FIG. 8 shows a flowchart of a clock generation method. In step S810, first and second input clocks are provided to a phase locked loop, such that the phase locked loop generates an output clock. For example, as shown in FIG. 5, the first input clock S1 and the second input clock S2 are provided to the phase locked loop 10", such that the phase locked loop 10" generates the output clock SOUT.

In step S820, a modulation signal is generated according to an input signal SC with a constant level. For example, the modulation unit 30" generates the modulation signal MS and supplies the modulation signal MS to the delay line 20". In the modulation unit 30", the input signal SC with a constant level as shown in FIG. 6 is supplied to an integrator 34, and the integrated signal serves as the modulation signal MS. The modulation signal MS is supplied to the delay line 20" and the quantizer 38. The quantizer 38 outputs a value SQ to the scaling unit 36 and the frequency divider 60" according to the modulation signal MS. For example, when the modulation signal MS reaches a threshold value TH, the quantizer 38 generates a value SQ of "1", and the value SQ of 1 is scaled by the scaling unit 36 and outputs it to the subtractor 33. Hence, the subtractor 33 subtracts the scaled value from the modulation signal MS of the integrator 34, such that the modulation signal MS is reset and becomes zero accordingly. As shown in FIG. 6, the modulation signal MS is reset by the scaled value output from the scaling unit 36 at time t1, t2, t3 and t4 and so on. Moreover, when the modulation signal MS is reset (becomes zero) and below the threshold value TH, the quantizer 38 generates a value SQ of "0" until the modulation signal reaches the threshold value TH again. Hence, the input signal SC with a constant level would be integrated to the threshold value TH from zero again and again as shown in FIG. 6 to serve as the modulation signal MS.

In step S830, the output clock of the phase clocked loop is divided according to the modulation signal and the divided output clock is output to the phase locked loop. For example, the frequency divider 60" selectively divides the output clock SOUT of the phase locked loop 10" by a division factor N or N−1 based on the value SQ generated according to the modulation signal MS. When the modulation signal MS does not reach the threshold value TH, the frequency divider 60" divides the output clock SOUT by the division factor N−1 according the value SQ of '0'. On the contrary, when the modulation signal MS reaches the threshold value TH, the frequency divider 60" divides the output clock SOUT by the division factor N according to the value SQ of "1".

In step S840, phase of a first input clock of the phase locked loop or that of the divided output clock is modulated according to the modulation signal. For example, as shown in FIG. 5, the delay line 20" modulates the phase of the divided output clock from the frequency divider 60" according to the modulation signal MS. As shown in FIG. 7, the delay line 20" delays the phase of the input clock S1 according to the modulation signal MS. In should be noted that, according to the modulation signal MS, the delay line 20" and the frequency divider 60 are controlled to perform a frequency division to the output clock SOUT by a fractional division factor. Meanwhile, the frequency of the output clock SOUT is locked at a desired frequency.

Examples illustrating that the frequency divider 60" and the delay line 20" divide the output clock SOUT by a division factor between 10 and 11 are discussed hereinafter.

Division factor=10.5

Assuming that the output clock SOUT is 100 MHz (i.e., the period of the output clock SOUT is 10 ns), then the frequency divider 60" selectively divides the output clock SOUT by 10 or 11 according to the value SQ. Accordingly, the period of the divided output clock from the frequency divider 60" is 100 ns when the output clock SOUT is divided by 10, and the period of the divided output clock from the frequency divider 60" is 110 ns when the output clock SOUT is divided by 11.

During a first time interval, the frequency divider 60" divides the output clock SOUT by 10, and the delay unit 20" delays the divided output clock from the frequency divider 60" for 5 ns. For example, the frequency divider 60" asserts a first rising edge at time 100 ns when 10 periods of 10 ns have been counted, and the delay unit 20" delays the first rising edge for 5 ns, such that the first rising edge is presented at the input terminal of the phase locked loop 10" at time 105 ns. During a second time interval, the frequency divider 60" divides the output clock SOUT by 11 and the delay unit 20" does not delay the divided output clock from the frequency divider 60". For example, the frequency divider 60" asserts a second rising edge at time 210 ns when 11 periods of 10 ns have been counted after time 100 ns. The second rising edge is presented at the input terminal of the phase locked loop 10" at time 210 ns because the delay unit 20" does not delay the second rising edge.

During a third time interval, the frequency divider 60" divides the output clock SOUT by 10 again and the delay unit 20" delays the divided output clock from the frequency divider 60" for 5 ns again. For example, the frequency divider 60" asserts a third rising edge at time 310 ns when 10 periods of 10 ns have been counted after time 210 ns, and the delay unit 20" delays the third rising edge for 5 ns, such that the third rising edge is presented at the input terminal of the phase locked loop 10" at time 315 ns. During a fourth time interval, the frequency divider 60" divides the output clock SOUT by 11 and the delay unit 20" does not delay the divided output clock from the frequency divider 60". For example, the frequency divider 60" asserts a fourth rising edge at time 420 ns when 11 periods of 10 ns have been counted after time 310 ns. The fourth rising edge is presented at the input terminal of the phase locked loop 10" at time 420 ns because the delay unit 20" does not delay the fourth rising edge. As for the other time intervals, descriptions may be deduced from the previously described time interval descriptions. In this example, the rising edges are present at the input terminal of the phase locked loop 10" at 105 ns, 210 ns, 315 ns, 420 ns, and so on, i.e., the period of the input clock S2 is 105 ns and the frequency of the input clock S2 is 9.5238 MHz. Thus, the division factor implemented by the delay line 20" and the frequency divider 60" can be regarded as 10.5 because $$\frac{100 \text{ MHz}}{10.5}$$

is equal to 9.5238M Hz.

In some examples, the division factor implemented by the delay line 20" and the frequency divider 60" can also be 10.1, 10.2, 10.3, 10.4, 10.6, 10.7, 10.8 or 10.9 according to the modulation signal MS and the value SQ. If N is 12, the division factor implemented by the delay line 20" and the frequency divider 60" can be 11.1, 11.2, 11.3, . . . , 11.8 or 11.9 according to the modulation signal MS and the value SQ. If N is 13, the division factor implemented by the delay line 20" and the frequency divider 60" can be 12.1, 12.2, 12.3, . . . , 12.8 or 12.9 according to the modulation signal MS and the value SQ, and so on. It is acknowledged that an integer portion of the fractional division factor is determined by N−1, and a decimal portion of the fractional division factor is determined by the modulated phase of the divided output clock. Because the division factor implemented by the delay line 20" and the frequency divider 60" can be designed to any value according to the modulation signal MS and the value SQ, the frequency of the output clock SOUT of the clock generators shown in FIGS. 5 and 7 can be locked at a desired frequency.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock generator, comprising:
a phase locked loop generating an output clock;
a delay line coupled to an input of the phase locked loop;
a frequency divider dividing the output clock by a division factor according to the modulation signal; and
a modulation unit integrating an input signal with a constant level to generate a modulation signal controlling the delay line, thereby modulating a phase of a first input clock of the phase locked loop, such that frequency of the output clock is locked at a desired frequency,
wherein when the modulation signal reaches a threshold value, the division factor is switched.

2. The clock generator as claimed in claim 1, wherein the frequency divider generates the first input clock according to the output clock from the phase licked loop.

3. The clock generator as claimed in claim 2, wherein the frequency divider divides the output clock by the division factor of N−1 or the division factor of N according to the modulation signal, and N is an integer.

4. The clock generator as claimed in claim 3, wherein the modulation unit further comprises a quantizer triggering the frequency divider to divide the output clock from the phase locked loop by the division factor of N when the modulation signal exceeds the threshold value.

5. The clock generator as claimed in claim 1, further comprising the frequency divider generating a second input clock of the phase locked loop according to the output clock, such that the phased locked loop generates the output clock according to the second input clock and the modulated first input clock.

6. The clock generator as claimed in claim 5, wherein the frequency divider divides the output clock by the division factor of N−1 or the division factor N according to the modulation signal to generate the second input clock wherein N is an integer.

7. The clock generator as claimed in claim 6, wherein the modulation unit further comprises a quantizer triggering the frequency divider to divide the output clock by the division factor of N when the modulation signal exceeds the threshold value.

8. A clock generator, comprising:
a phase locked loop generating an output clock according to a first input clock and a second input clock;
a frequency divider dividing the output clock by a division factor to generate a divided output clock, wherein the division factor is switched according to a first control signal;
a delay line modulating a phase of one of the first and second input clocks according to a second control signal, wherein the delay line and the frequency divider are controlled to perform a frequency division to the output clock by a fractional division factor, according to the first and second control signals; and
a modulation unit integrating an input signal with a constant level to generate the first control signal and the second control signal;
wherein the first control signal is generated when the second control signal exceeds a threshold.

9. The clock generator as claimed in claim 8, wherein the frequency divider divides the output clock by the division factor of N−1 or the division factor N according to the first control signal.

10. The clock generator as claimed in claim 9, wherein the delay line modulates a phase of the divided output clock from the frequency divider to generate the second input clock.

11. The clock generator as claimed in claim 9, wherein an integer portion of the fractional division factor is determined by N−1, and a decimal portion of the fractional division factor is determined by the modulated phase of the divided output clock from the frequency divider.

12. The clock generator as claimed in claim 9, wherein the divided output clock serves as the second input clock, and the delay line modulates a phase of the first input clock.

13. A clock generator, comprising:
a modulation unit integrating an input signal with a constant level to generate a first control signal and a second control signal;
a phase locked loop generating an output clock according to a first input clock and a second input clock;
a frequency divider dividing the output clock by a division factor to generate the divided output clock, wherein the division factor is switched according to the first control signal; and
a delay line modulating a phase of the divided output clock to output the modulated and divided output clock serving as the second input clock according to the second control signal, such that frequency of the output clock is locked at a desired frequency, and according to the first and second control signals, the delay line and the frequency divider are controlled to perform a frequency division to the output clock by a fractional division factor;
wherein the first control signal is generated when the second control signal exceeds a threshold.

14. A clock generator, comprising:
a modulation unit integrating an input signal with a constant level to generate a first control signal and a second control signal;
a phase locked loop generating an output clock;
a delay line modulating a phase of a first input clock of the phase locked loop to output the modulated clock according to the second control signal; and
a frequency divider dividing the output clock by a division factor to generate a second input clock of the phase locked loop, wherein the division factor is switched according to the first control signal, such that the phase locked loop generates the output clock and frequency of the output clock is locked at a desired frequency, according to the modulated clock and the second input clock,
wherein the delay line and the frequency divider are controlled to perform a frequency division to the output clock by a fractional division factor, according to the first and second control signals;
wherein the first control signal is generated when the second control signal exceeds a threshold.

15. A clock generation method, comprising:
providing a modulation signal;
dividing an output clock of a phase clocked loop according to the modulation signal;
modulating a phase of a first input clock of the phase locked loop or that of the divided output clock according to the modulation signal, such that the output clock is divided by a fractional division factor, wherein the divided output clock serves as a second input clock of the phase locked loop when the phase of the first input clock is modulated, or the modulated and divided output clock serves as the second input clock of the phase locked loop when the phase of the divided output clock is modulated; and
integrating an input signal with a constant level to generate the modulation signal;

wherein the output clock is divided by N−1 when the modulation signal does not reach a threshold value and the output clock is divided by N when the modulation signal reaches the threshold value.

16. The clock generation method as claimed in claim 15, wherein an integer portion of the fractional division factor is determined by N−1, and the a decimal portion of the fractional division factor is determined by the modulated phase of the divided output clock.

* * * * *